US006932625B2

(12) United States Patent
Yagi et al.

(10) Patent No.: US 6,932,625 B2
(45) Date of Patent: Aug. 23, 2005

(54) JUNCTION SOCKET WITH A MOVEABLE CONTACT PIECE

(75) Inventors: Sakai Yagi, Shizuoka (JP); Yasutaka Miyazaki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/970,657

(22) Filed: Oct. 22, 2004

(65) Prior Publication Data

US 2005/0112958 A1 May 26, 2005

(30) Foreign Application Priority Data

Oct. 24, 2003 (JP) ............................ 2003-364517

(51) Int. Cl.[7] .......................... H01R 12/00; H05K 1/00
(52) U.S. Cl. ...................... 439/76.2; 439/787; 439/949
(58) Field of Search .............................. 439/76.2, 949, 439/787, 621, 852, 796, 723

(56) References Cited

U.S. PATENT DOCUMENTS 4,992,062 A * 2/1991 Nakayama et al. ......... 439/621
5,122,083 A * 6/1992 Watanabe et al. ........... 439/787
5,383,800 A * 1/1995 Saka et al. .................. 439/787
5,603,626 A * 2/1997 Oka et al. ................... 439/224
5,755,579 A * 5/1998 Yanase et al. ............ 439/76.2

FOREIGN PATENT DOCUMENTS

JP 2002-78153 3/2002

* cited by examiner

*Primary Examiner*—Hae Moon Hyeon
(74) *Attorney, Agent, or Firm*—Armstrong, Kratz, Quintos, Hanson & Brooks, LLP

(57) ABSTRACT

A receptacle of this junction socket includes a resilient contact piece extended from a front wall, and bent twice inwardly in vicinities of top and bottom openings of the receptacle; a movable contact piece as a rear wall facing to the resilient contact piece, and able to rotate around spindles provided on both of the sidewalls respectively. The receptacle receives upper and lower male terminals in directions opposite to each other, and electrically connects them to each other. When inserting the terminals, the movable contact piece rotates to align along an insertion direction of the upper male terminal.

6 Claims, 5 Drawing Sheets

JUNCTION SOCKET WITH A MOVEABLE CONTACT PIECE

The priority application Number Japanese Patent Application No. 2003-364517 upon which this patent application is based is hereby incorporated by reference.

BACKGROUND OF THE INVENTION

1. Field of the Invention

This invention relates to a junction socket applied to an electrical junction box for connecting wire harnesses to each other and the like. This junction socket is used for connecting a male terminal projecting from an end of a bus bar to a male terminal extended from an electronic component.

2. Description of the Related Art

Generally, a case of an electrical junction box, such as a fuse box, a relay box, a junction box, accommodates bus-bar-circuit boards, and they are stacked if necessary. Each of these bus-bar-circuit boards is configured with a plurality of bus bars and an insulating circuit board for supporting these bus bars. A fuse mounting block, a relay mounting block, and a connector mounting block for connecting a wire harness, are provided on an outer surface of the case. A male tab (flat) terminal is formed projectingly from the bus bar. Male tab terminals are extended from electronic components such as the fuse or the relay. These male terminals of the bus bars and the electronic components are formed opposite to each other and connected to each other via the junction socket.

An embodiment of a conventional junction socket is shown in FIG. 7 and disclosed in Japanese Patent Application Document Laid-Open No. 2002-78153 (Page 3 to 4, FIG. 2). According to this embodiment, the junction sockets are easily mounted on the electrical junction box, and assembling workability of the electrical junction box is improved. The electrical junction box (not shown) includes a circuit board having bus-bars; an upper cover to cover an upper surface of the circuit board, on which electronic components such as a relay or a fuse are mounted; and a lower cover to cover a lower surface of the circuit board. A junction socket 50 for connecting a male terminal 57 formed on an end of the bus bar to a male terminal 58 extended from the electronic component is temporarily locked in a terminal receiving part with a terminal locking member. Then, the upper cover covers the circuit board to connect the junction socket 50 to the male terminal 57 of the bus bar.

Stamping and bending a conductive substrate forms the junction socket 50. This junction socket 50 includes a receptacle 51 having openings at both ends, and a resilient contact piece 53 formed integrally with the receptacle 51.

The resilient contact piece 53 includes a first terminal contact convex 53*a*, which is extended from a front wall 51*a* of the receptacle 51 and bent inward, and a second terminal contact convex 53*b*, which is formed by further bending a front end of the first terminal contact convex 53*a*.

The male terminal 58 of the electronic component is inserted from a top opening 55 of the receptacle 51 and held between a rear wall 51*b* and the first terminal contact convex 53*a*. The male terminal 57 of the bus bar is inserted from a bottom opening 56 of the receptacle 51 and held between the second terminal contact convex 53*b* and a front wall 51*a*.

However, there are problems as follows to be solved in this conventional junction socket. Both of male terminals 57, 58 have face to face contact with front and rear walls 51*a*, 51*b* of the receptacle 50 respectively. Therefore, as shown in FIG. 8, when the male terminals 57, 58 are inserted obliquely, contact positions on the walls 51*a*, 51*b* are shifted, so that the male terminals 57, 58 no longer have face to face contact with the walls 51*a*, 51*b*. Further, contacting parts of walls 51*a*, 51*b* no longer face to terminal contact convexes 53*a*, 53*b* respectively via male terminals 57, 58. Therefore, distal ends of male terminals 57, 58 may be deformed by bending moment, or the resilient contact piece may be pried by the male terminals 57, 58 to be plastically deformed.

Further, when a base side of the resilient contact piece 53 having a curve shape is pried by the male terminals 57, 58, the resilient contact piece 53 may be turned into a crushed shape. Therefore, contact pressure between the male terminals 57, 58 and terminal contact convexes 53*a*, 53*b* may decrease to reduce contact stability. Further, when the resilient contact piece 53 is crushed, resiliency of the resilient contact piece 53 may be weakened. This also may reduce contact stability.

These problems can be solved to some extent by managing precisely sizes of the male terminal 57 of the bus bar and the male terminal 58 of the electronic component. However, this cannot solve the problem perfectly. Further, managing precisely sizes of those including a plurality of small electronic components in the electrical junction box makes another problems such as increasing electronic components cost, or reducing assembling workability. Thus, there are demands for a junction socket that can easily compensate for dimensional errors of the male terminals 57, 58 and for assembling errors without managing sizes of the male terminals 57, 58 precisely to improve the contact stability.

For resolving the problems described above, an object of this invention is to provide a junction socket, which prevents a resilient contact piece from being deformed by prying when inserting a male terminal; guarantees stable contact pressure between the terminals; and thereby improves contact stability between the terminals.

SUMMARY OF THE INVENTION

In order to attain the object, according to a first aspect of this invention, there is provided a junction socket having a receptacle to receive upper and lower male terminals in directions opposite to each other and to electrically connect the male terminals to each other, said junction socket including:

- a first wall;
- a second wall;
- sidewalls at both sides of the first and second walls;
- top and bottom openings formed respectively at both ends of the first and second walls; and
- a resilient contact piece extended from the first wall, and bent twice inwardly in vicinities of the top and bottom openings of the receptacle,
- said second wall being configured with a movable contact piece facing to the resilient contact piece and spindles around which the movable contact piece is rotatable to align along an insertion direction of the upper male terminal,
- whereby the upper male terminal to be inserted into the top opening from a base of the resilient contact piece, is held between the resilient contact piece and the movable contact piece, and the lower male terminal to be inserted into the bottom opening, is held between the front wall and the resilient contact piece.

According to the above, since the junction socket includes the resilient contact piece and the movable contact piece, plastic deformation of the resilient contact piece positioned between the male terminals is smaller than those of a conventional junction socket. Namely, the resilient contact piece is prevented from being pried and crashed by male terminals being inserted obliquely.

According to the first aspect of the invention, preferably, there is provided the junction socket, wherein the spindles are supported rotatably by both of sidewalls respectively.

According to the above, when the upper male terminal is inserted obliquely, the spindles are so rotated to tilt the movable contact piece in a direction along the inserting direction of the male terminal.

According to the first aspect of the invention, preferably, there is provided the junction socket, wherein the movable contact piece is resilient.

According to the above, when the upper male terminal is inserted obliquely, the movable contact piece is bent along the inserting direction of the male terminal. Thereby, clearances between the terminals of this invention are wider than those of the conventional junction socket. Contact pressure between the terminals is prevented from being reduced. Therefore, contact stability between the terminals is improved. Further, the resilient contact piece is prevented from losing resiliency. Spring constant of the resilient contact piece is prevented from increasing. Therefore, the contact stability between the terminals is maintained over a long period.

According to the first aspect of the invention, preferably, there is provided the junction socket, wherein a contact projection facing to the resilient contact piece is provided on the first wall.

According to the above, the lower male terminal is held between the contact projection and the resilient contact piece, and supported with a gap between the lower male terminal and the front wall. Thereby, this junction socket can compensate for angle errors of an insertion of the lower male terminal. Therefore, even when the lower male terminal is inserted obliquely, this junction socket can stabilize the contact pressure between the terminals.

According to a second aspect of the invention, there is provided a junction socket having a receptacle to receive upper and lower male terminals in directions opposite to each other and to electrically connect the male terminals to each other, said junction socket including:

- a first wall;
- a second wall;
- sidewalls at both sides of the first and second walls;
- top and bottom openings formed at both ends of the first and second walls;
- a resilient contact piece extended from the first wall, and bent twice inwardly in vicinities of the top and bottom openings of the receptacle;
- a first contact projection facing to the resilient contact piece and being provided on the first wall; and
- a second contact projection facing to the resilient contact piece and being provided on the second wall,
- wherein the upper male terminal to be inserted into the top opening from a base of the resilient contact piece, is held between the resilient contact piece and the second projection on the second wall, and the lower male terminal to be inserted upward into the bottom opening, is held between the resilient contact piece and the first projection on the first wall.

According to the above, both of the male terminals inserted in directions opposite to each other are held between the resilient contact piece and the first contact projection on the first wall, and between the resilient contact piece and the second contact projection on the second wall, with gaps from the first and second walls respectively. Thereby, this junction socket can compensate for angle errors of both male terminals. Therefore, even when the male terminals are inserted obliquely, the contact pressure between the terminals is prevented from changing. Therefore, stability of electrical connections between the terminals is improved.

According to the second aspect of the invention, preferably, there is the junction socket, wherein the first and second contact projections face respectively to a first and second convexes on the resilient contact piece.

According to the above, even when the male terminals are inserted obliquely, they are surely held between the contact projections of respective walls and the resilient contact piece. Therefore, angle errors of the male terminals are compensated, and contact stability of the male terminals is improved. Further, since a force couple does not act on the male terminals, the male terminals are prevented from being deformed.

DESCRIPTION OF THE PREFERRED EMBODIMENT

Figure 1:
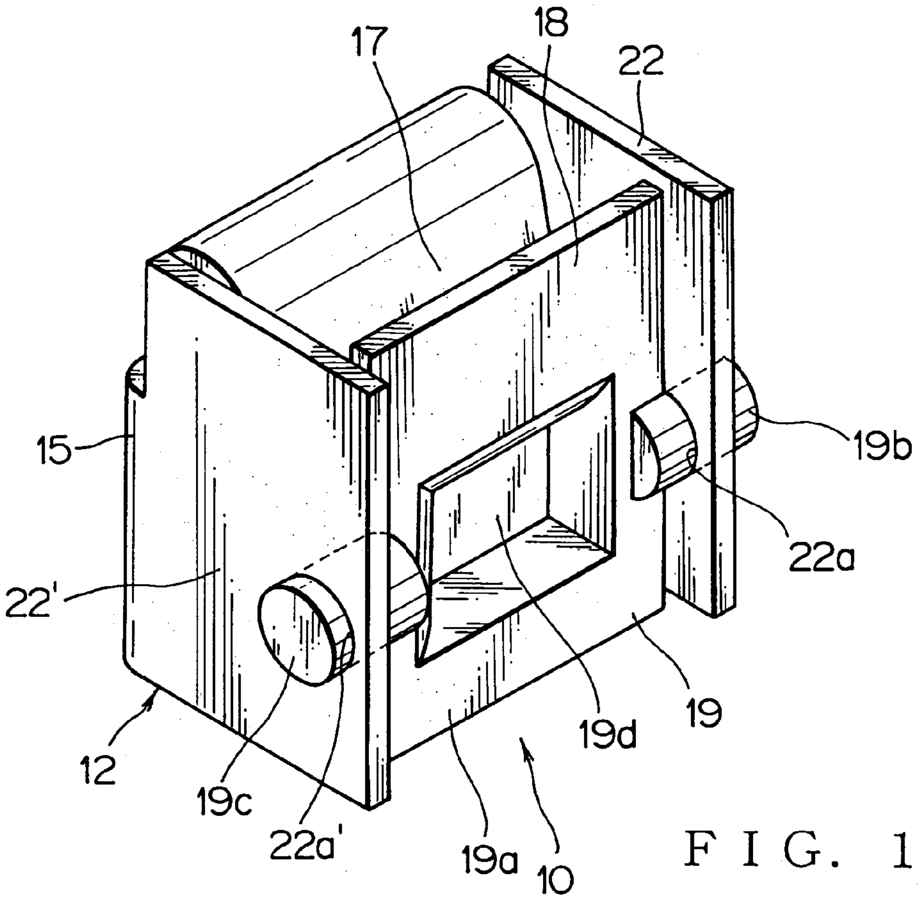
FIG. 1 is a perspective view showing a first embodiment of a junction socket according to this invention.

Some embodiments according to this invention will be explained in detail with reference to Figures.

Junction sockets 10, 10', 25 are applied to a junction box 30 in which wire harnesses are connected to each other. The junction sockets 10, 10', 25 electrically connect a tab (flat) male terminal **32*a* projecting from an end of a bus bar 32 to a tab male terminal 40*a* extended from a relay 40**.

These junction sockets 10, 10', 25 are produced by a press process. This press process includes stamping, embossing, and folding processes. Conductive substrates (not shown) such as beryllium-copper are carried one after another, per one stroke of a press machine (not shown), to a space between upper and lower press molds (not shown). At an end of the process, semi-final or final products are ejected. Attaching a movable contact piece 19 to a semi-final product produces a final product of the junction socket 10 in a first embodiment. Only supplying a conductive substrate to the press machine produces the junction socket 25 of a second embodiment having a shape shown in FIG. 4.

Figure 4:
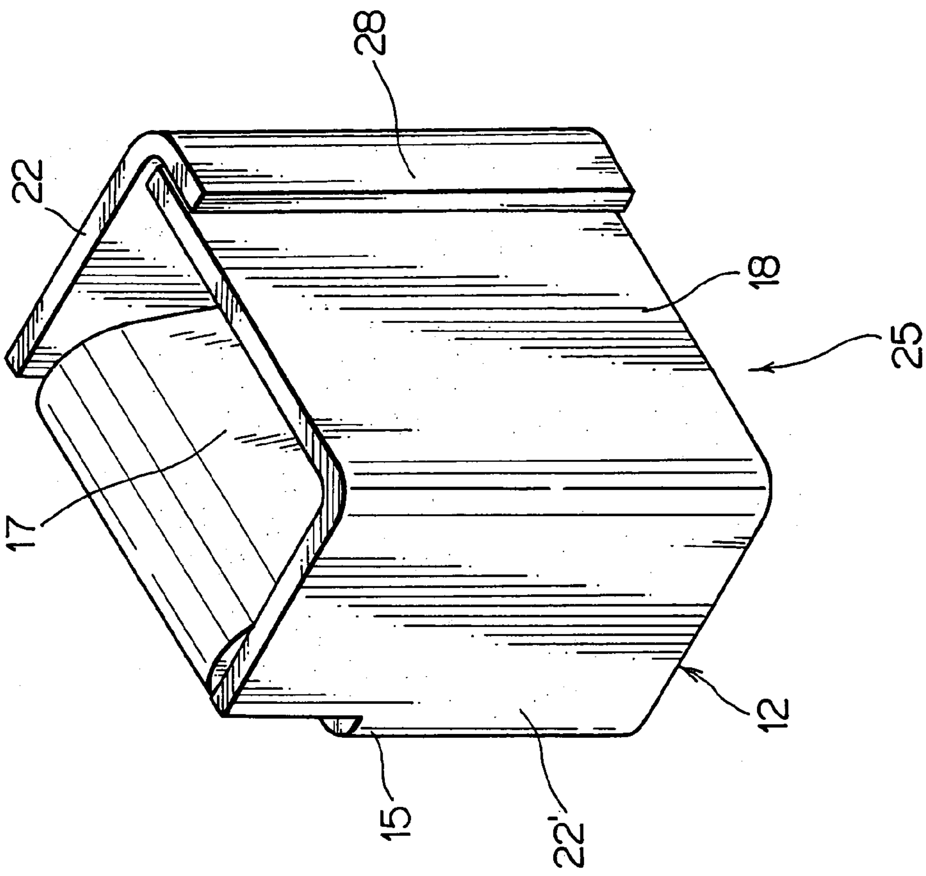
FIG. 4 is a perspective view showing a second embodiment of the junction socket according to this invention.

The junction sockets 10, 25 as shown respectively in FIGS. 1 and 4 are applied to a junction box 30, which is connected to a main ECU (electronic control unit) of a hybrid vehicle. This junction box 30 is configured with a case body (not shown), made of insulating resin having upper and lower print circuit boards (only upper circuit board 31 being shown); a lower cover (not shown) for protecting a lower surface of the case body; and an upper cover 35 for covering an upper surface of the case body.

The case body is configured with a middle lower cover on which the lower circuit board is mounted; and a middle upper cover on which the upper circuit board 31 is mounted. Each circuit board is configured with a bus bar 32 made of a stamped conductive substrate; and an insulating board 33. At a front end of the bus bar 32, the upwardly projecting male terminal 32*a* is bent by the folding process at a position corresponding to a position of the male terminal 40*a* extended from the relay 40.

The upper cover 35 is made of synthetic resin. Mounts 36, 37, 38, 39 are formed on an upper surface of the upper cover 35. A relay 40, a fuse (not shown), a wire harness for an inverter (not shown), a service plug for an interlock (not shown) are mounted respectively on the mounts 36, 37, 38, 39. Four male terminals are extended downward from each relay 40 at positions corresponding to positions of the male terminals 32*a* of the bus bars 32.

A junction socket mount (not shown) is formed on a lower surface of the upper cover 35. The junction socket 10 is previously locked on the junction socket mount temporary. Then, by covering the case body with the upper cover 35, the junction socket 10 is connected to the male terminal 32*a* of the bus bar 32.

Eight junction sockets 10 are positioned in between the bus bar 32 and the relay 40. The male terminals 32*a*, 40*a* are connected to each other via the junction sockets 10. When the bus bar 32 and the relay 40 are electrically connected to each other, an electric current source from a battery and signal currents from various sensors are branched.

The junction socket 10 of this first embodiment prevents a resilient contact piece 17 from being pried to be damaged by the male terminals 32*a*, 40*a* being inserted into the junction socket 10. Further, this junction socket 10 guarantees stable contact pressure between the terminals, and thereby improves contact stability between the terminals.

This junction socket 10 has a receptacle 12 to receive upper and lower male terminals 40*a*, 32*a* in directions opposite to each other and to electrically connect them to each other. This junction socket includes a front wall 15; a rear wall 18; sidewalls 22, 22' at both sides of the front and rear walls 15, 18; top and bottom openings 13, 14 formed respectively at both ends of the front and rear walls 15, 18; and the resilient contact piece 17 extended from the front wall 15, and bent twice inwardly in vicinities of the top and bottom openings 13, 14 of the receptacle 12. The rear wall 18 is configured with a movable contact piece 19 facing to the resilient contact piece 17 and spindles 19*b*, 19*c*. The movable contact piece 19 is rotatable around the spindles 19*b*, 19*c* to align along an insertion direction of the upper male terminal 40*a*. When being inserted downward into the top opening 13 from a base of the resilient contact piece 17, the upper male terminal 40*a* is held between the resilient contact piece 17 and the movable contact piece 19. When being inserted upward into the bottom opening 14, the lower male terminal 32*a* is held between the front wall 15 and the resilient contact piece 17. Further, in this first embodiment, the movable contact piece 19 is resilient.

Figure 2B:
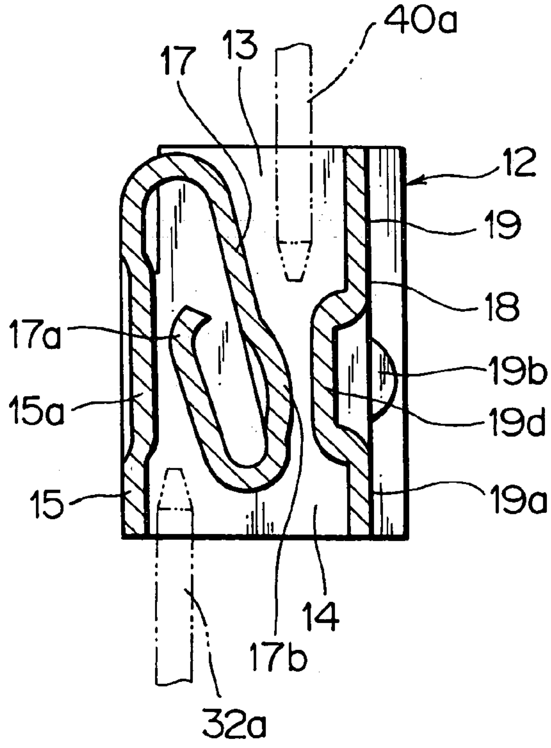
FIG. 2B is a section view taken on line A–A' of FIG. 2A.
Figure 2A:
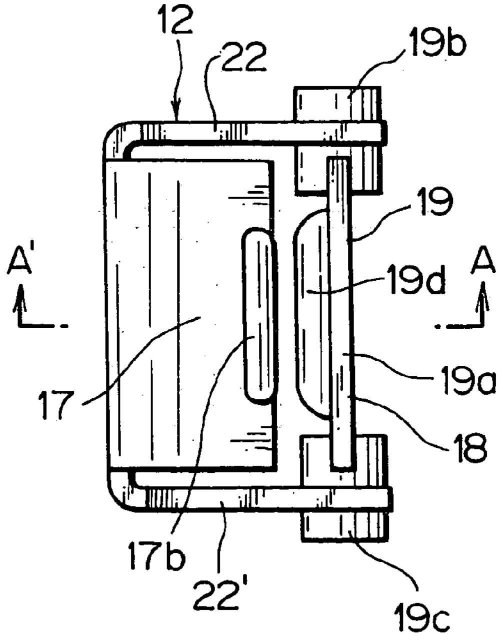
FIG. 2A is a front view showing the junction socket of FIG. 1.

A configuration and functions of the junction socket 10 in this first embodiment according to this invention will be explained in detail below. The junction socket 10 is a short type socket produced by, for example, stamping and folding a conductive substrate. This junction socket 10 includes the receptacle 12. The receptacle 12 is configured with the front wall 15 as substantially a main body; sidewalls 22, 22' formed by folding walls extended from both sides of the front wall 15 to a right angle; and the movable contact piece 19 supported rotatably by the sidewalls 22, 22' via the spindles 19*b*, 19*c*. As shown in FIG. 2B, the male terminal 40*a* of the relay 40 is inserted from the top opening 13, and the male terminal 32*a* of the bus bar 32 is inserted from the bottom opening 14 into the receptacle 12.

The front wall 15 is substantially flat. However, as shown in FIG. 2B, a middle of the front wall 15 is embossed inward in a vertical direction. An embossed part 15*a* is formed so flat as to make contact face to face with the male terminal 32*a*.

The resilient contact piece 17 is extended from the front wall 15, and firstly bent inward at the top opening 13 in U-shape into the receptacle 12. The resilient contact piece 17 is secondly bent inward just before the bottom opening 14 so that a first, downward terminal-contact convex 17*a* is provided facing to the front wall 15 in the receptacle 12. A middle part, existing between the firstly and secondly bent parts of the resilient contact piece 17, faces to, and is inclined toward the movable contact piece 19. A second, upward terminal-contact convex 17*b* is provided at the middle part.

A rear wall 18 is formed separately from the rest of walls, and includes the movable contact piece 19 as a plate 19*a* and the spindles 19*b*, 19*c*. These spindles 19*b*, 19*c* are formed in a middle of, and at both edges of the plate 19*a*. A third terminal-contact part 19*d* is formed in an inward convex shape inside the receptacle 12 by embossing. The male terminal 40*a* is held between the resilient contact piece 17 and the third terminal-contact part 19*d*.

When the spindles 19*b*, 19*c* are inserted into through-holes 22*a*, 22*a'* formed on both of the sidewalls 22, 22', the movable contact piece 19 is supported rotatably and rotates to align along an insertion direction of the male terminal 40*a*. Therefore, the movable contact piece 19 rotates to compensate for angle errors of the male terminal 40*a*, and prevents the male terminal 40 from prying the resilient contact piece 17. Thereby the resilient contact piece 17 is prevented from being plastically deformed. Further, a face contact state between the male terminal 40*a* and the third terminal-contact part 19*d* is maintained. Therefore, contact stability between the male terminal 40*a* and the third terminal-contact part 19*d* is improved.

Figure 3:
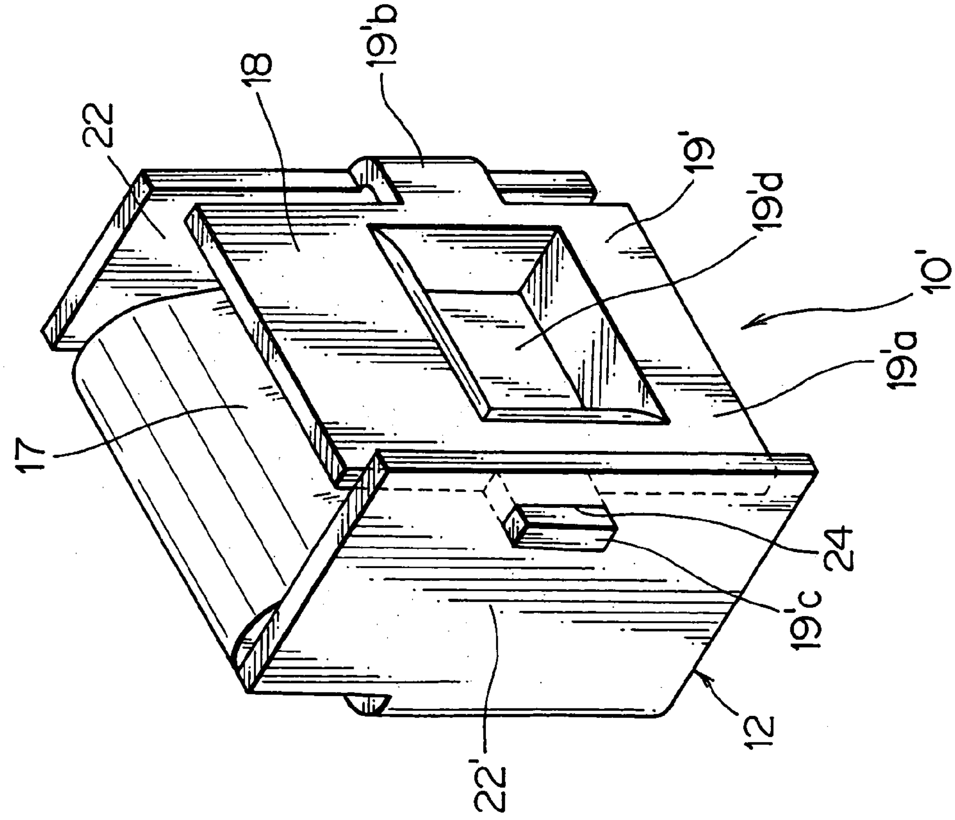
FIG. 3 is a perspective view showing a junction socket modified from the junction socket of FIG. 1.

FIG. 3 shows a modified first embodiment in which the junction socket 10 of FIG. 1 is modified. A junction socket 10' is formed integrally by a press process including stamping, embossing, and folding a conductive substrate. Therefore, productivity of this junction socket 10' is higher than that of the junction socket 10 of FIG. 1. A pair of spindles 19*b'*; 19*c'* are formed on a movable contact piece 19'. The spindle 19*b'* has a hinge shape, and is continued to the sidewall 22 of the receptacle 12. The spindle 19*c'* is engaged with a slit 24 penetrating the sidewall 22'. Therefore, the spindles 19*b'*, 19*c'* of this modified first embodiment are not rotatable. However, the movable contact piece 19' is resilient. Therefore, when the male terminal 40*a* is inserted obliquely, the movable contact piece 19' is deformed along an insertion direction of the male terminal 40*a*. Thus, the junction socket 10' exerts the same effect as the junction socket 10 of FIG. 1.

Figure 5B:
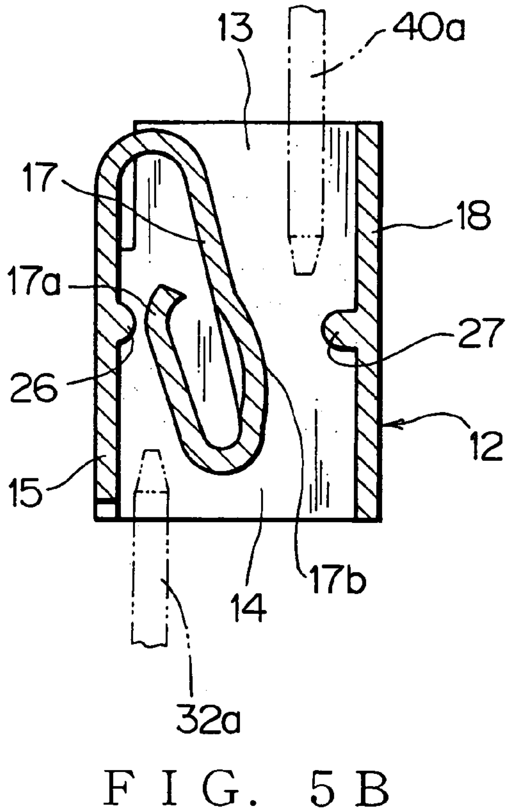
FIG. 5B is a section view taken on line B–B' of FIG. 5A.
Figure 5A:
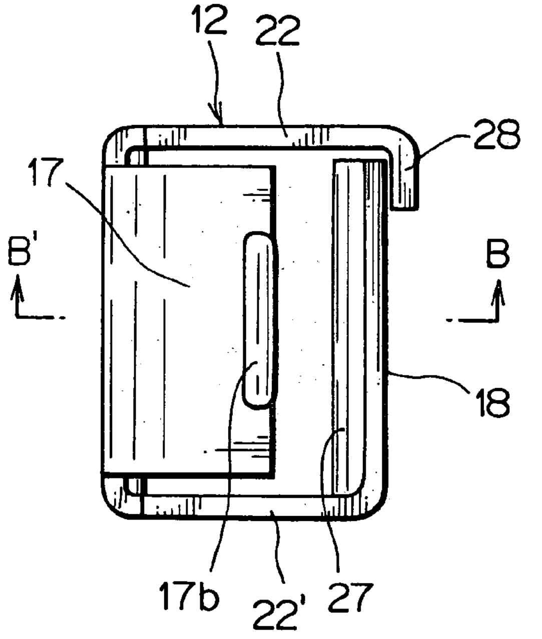
FIG. 5A is a front view showing the junction socket of FIG. 4.
Figure 6:
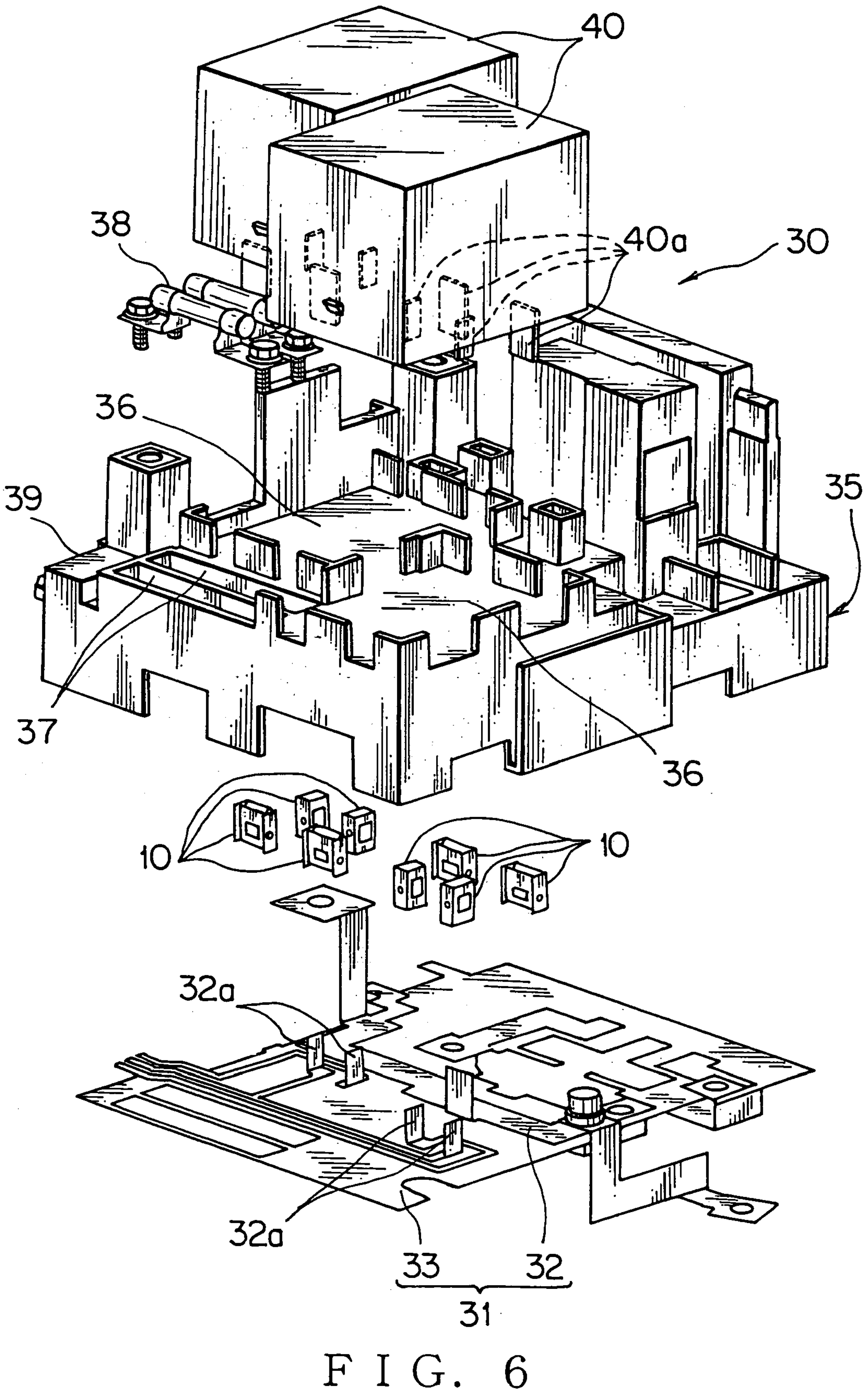
FIG. 6 is a partially exploded perspective view of a junction box to which the junction socket of this invention is applied.
Figure 8:
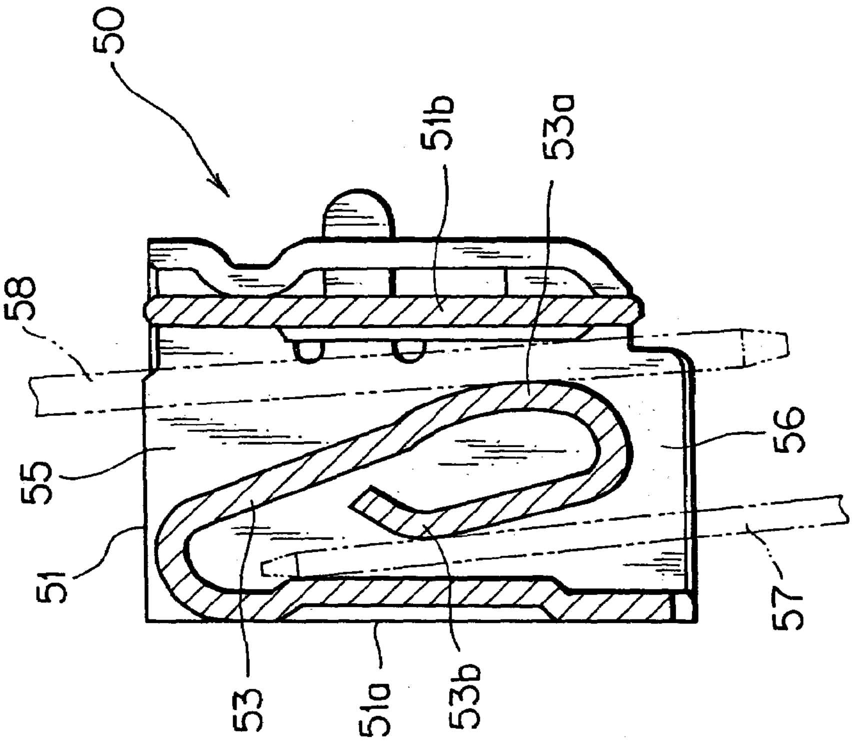
PRIOR ART FIG. 8
FIG. 8 is a section view showing a state that male terminals are inserted obliquely into the junction socket of FIG. 7.
Figure 7:
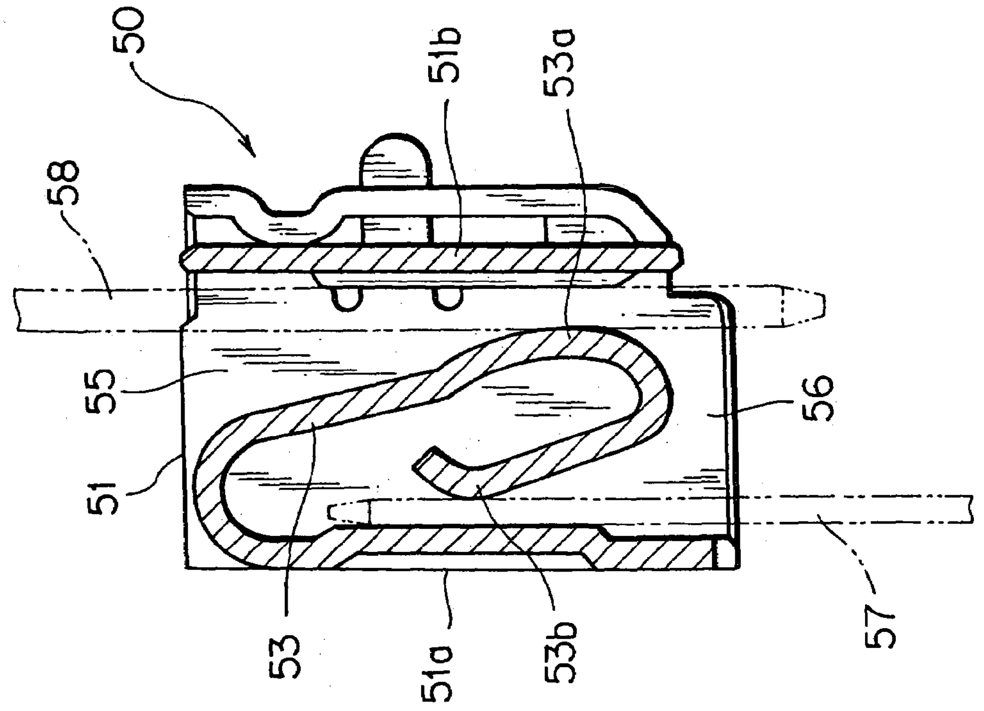
PRIOR ART FIG. 7
FIG. 7 is a section view showing an embodiment of a conventional junction socket.

Next, a junction socket 25 as a second embodiment according to this invention will be explained with reference to FIGS. 4 and 5. In order to avoid repetitions, identical elements will be designated by identical reference numerals and only the difference existing in comparison with the first embodiment will be explained.

The junction socket 25 can compensate for angle errors of the two male terminals 32*a*, 40*a*, being inserted thereinto in directions opposite to each other, with a simple configuration. A resilient contact piece 17 is extended from a front wall 15, and bent twice inwardly in vicinities of an top and bottom openings 13, 14 of the receptacle 12. A first contact projection 26 facing to the resilient contact piece 17 is provided on the front wall 15. A second contact projection 27 facing to the resilient contact piece 17 is provided on the rear wall 18. When being inserted downward into the top opening 13 from a base of the resilient contact piece 17, the upper male terminal 40*a* is held between the resilient contact piece 17 and the second contact projection 27 on the rear wall 18. When being inserted upward into the bottom opening 14, the lower male terminal 32*a* is held between the resilient contact piece 17 and the first contact projection 26 on the front wall 15. Further, in this second embodiment, the first and second contact projections 26, 27 of the front and rear walls 15, 18 respectively face to terminal contact convexes 17*a*, 17*b* on the resilient contact piece 17.

The junction socket 25 is formed integrally from a conductive substrate like the junction socket 10' of the modified first embodiment. A press process including stamping, embossing, and folding produces this junction socket 25. A folded piece 28 is extended from the sidewall 22 and fixes the sidewall 22 on the rear wall 18.

There are differences between the junction socket 25 and the junction socket 10 in the first embodiment. One of these differences is the first contact projection 26 is provided on the front wall 15 at a position opposite to the first terminal contact convex 17*a* of the resilient contact piece 17, and the second contact projection 27 is provided on the rear wall 18 at a point opposite to the second terminal contact convex 17*b* in this second embodiment. The other difference is that the junction socket 25 has line contact or point contact with the male terminal 32*a* in this second embodiment. Generally, line or point contact has a higher contact pressure than face-to-face contact.

Since the first contact projection 26 is projected inward from the front wall 15, the male terminal 32*a* makes line-contact or point-contact with the first contact projection 26, and a clearance exists between the male terminal 32*a* and the front wall 15. Therefore, the male terminal 32*a* is rotatable around the first contact projection 26 within the clearance. Thus, the angle error of the male terminal 32*a* is compensated, and the resilient contact piece 17 is prevented from receiving an excessive force.

Since the second contact projection 27 is also projected inward from the rear wall 18, the male terminal 40*a* makes line-contact or point-contact with the second contact projection 27, and a clearance exists between the male terminal 40*a* and the rear wall 18. Therefore, the male terminal 40*a* is rotatable around the second contact projection 27 within the clearance. Thus, the angle error of the male terminal 40*a* is compensated. Therefore, a problem, that the male terminals 32*a*, 40*a* being inserted obliquely into the junction socket 25 pry and damage the resilient contact piece 17, is solved.

According to the second embodiment of this invention, the male terminals 32*a*, 40*a* being inserted in directions opposite to each other are supported by the first and second contact projections 26, 27 respectively, and have clearances from the front and rear walls 15, 18 respectively. Therefore, the angle errors of the male terminals 32*a*, 40*a* are compensated, and contact pressure between the terminals is prevented from changing. Thus, contact stability between the terminals is improved.

The present invention is not limited to the above embodiments, and various changes and modifications may be made within the scope of this invention. For example, modified embodiments described below can be applied. First, the movable contact piece 19 of the junction socket 10 of the first embodiment may be resilient. Thereby, the angle error of the male terminal 40*a* inserted obliquely is compensated more effectively. Secondly, two contact projections 26, 27 being provided on the front and rear walls 15, 18 respectively may be replaced with any one of the contact projections 26, 27.

What is claimed is:

1. A junction socket having a receptacle to receive upper and lower male terminals in such directions as opposite to each other and to electrically connect the male terminals, said junction socket comprising:

first and second walls;

sidewalls at both sides of the first and second walls;

top and bottom openings formed respectively at both ends of the first and second walls; and a resilient contact piece extended from the first wall, and bent twice inwardly in vicinities of the top and bottom openings of the receptacle, said second wall being configured with a movable contact piece facing to the resilient contact piece and spindles around which the movable contact piece is rotatable to align with an insertion direction of the upper male terminal, whereby the upper male terminal to be inserted into the top opening from a base of the resilient contact piece, is held between the resilient contact piece and the movable contact piece, and the lower male terminal to be inserted into the bottom opening, is held between the first wall and the resilient contact piece.

2. The junction socket as claimed in claim 1, wherein the spindles are supported rotatably by the sidewalls respectively.

3. The junction socket as claimed in claim 1, wherein the movable contact piece is resilient.

4. The junction socket as claimed in claim 1, wherein a contact projection facing to the resilient contact piece is provided on the first wall.

5. A junction socket having a receptacle to receive upper and lower male terminals in such directions as opposite to each other and to electrically connect the male terminals, said junction socket comprising:

first and second walls;

sidewalls at both sides of the first and second walls;

top and bottom openings formed at both ends of the first and second walls;

a resilient contact piece extended from the first wall, and bent twice inwardly in vicinities of the top and bottom openings of the receptacle;

a first contact projection facing to the resilient contact piece and being provided on the first wall; and a second contact projection facing to the resilient contact piece and being provided on the second wall, wherein the upper male terminal to be inserted into the top opening from a base of the resilient contact piece, is held between the resilient contact piece and the second projection on the second wall, and the lower male terminal to be inserted into the bottom opening, is held between the resilient contact piece and the first projection on the front wall.

6. The junction socket as claimed in claim 5, wherein the first and second contact projections of the first and second walls faces respectively to a first and second terminal contact convexes on the resilient contact piece.

* * * * *